United States Patent
Aton

(10) Patent No.: US 7,818,711 B2
(45) Date of Patent: Oct. 19, 2010

(54) SYSTEM AND METHOD FOR MAKING PHOTOMASKS

(75) Inventor: Thomas J. Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 417 days.

(21) Appl. No.: 11/940,990

(22) Filed: Nov. 15, 2007

(65) Prior Publication Data
US 2009/0128788 A1 May 21, 2009

Related U.S. Application Data

(63) Continuation-in-part of application No. 11/771,515, filed on Jun. 29, 2007, now abandoned.

(51) Int. Cl.
*G06F 17/50* (2006.01)
*G03F 1/00* (2006.01)

(52) U.S. Cl. .............................. 716/21; 716/19; 716/20; 430/5

(58) Field of Classification Search ............. 716/19–21; 430/5
See application file for complete search history.

(56) References Cited

U.S. PATENT DOCUMENTS

| | | | | |
|---|---|---|---|---|
| 6,578,177 | B2 * | 6/2003 | Wu et al. | 716/2 |
| 6,686,102 | B2 * | 2/2004 | Randall et al. | 430/5 |
| 6,721,938 | B2 * | 4/2004 | Pierrat et al. | 716/19 |
| 6,764,795 | B2 | 7/2004 | Aton et al. | |
| 6,993,741 | B2 * | 1/2006 | Liebmann et al. | 716/19 |
| 7,132,203 | B2 * | 11/2006 | Pierrat | 430/5 |
| 7,346,887 | B2 * | 3/2008 | Liebmann et al. | 716/21 |
| 7,735,056 | B2 * | 6/2010 | Aton et al. | 716/21 |
| 7,739,649 | B2 * | 6/2010 | Cote et al. | 716/19 |
| 2004/0023124 | A1 * | 2/2004 | Lin et al. | 430/5 |
| 2007/0231710 | A1 * | 10/2007 | Aton et al. | 430/5 |
| 2009/0004573 | A1 * | 1/2009 | Aton | 430/5 |
| 2009/0087619 | A1 * | 4/2009 | Aton et al. | 428/156 |

(Continued)

OTHER PUBLICATIONS

Aton, U.S. Appl. No. 11/771,515, filed Jun. 29, 2007.

(Continued)

*Primary Examiner*—Helen Rossoshek
(74) *Attorney, Agent, or Firm*—Warren L. Franz; Wade J. Brady, III; Frederick J. Telecky, Jr.

(57) ABSTRACT

The present application is directed a method for determining the position of photomask patterns in a mask making process. The method comprises providing one or more mask rules defining the minimum spacing between photomask patterns. The method further comprises determining the position of a first photomask pattern relative to an adjacent second photomask pattern, the first photomask pattern having a critical edge for defining a critical dimension of a first device structure and a non-critical edge for defining a non-critical dimension. The non-critical edge is attached to the critical edge so that the positioning of the non-critical edge will affect the length of the critical edge. The non-critical edge of the first photomask pattern is positioned a distance X from an edge of the second photomask pattern, wherein the distance X is chosen to be substantially the minimum spacing allowed by the mask rules. Embodiments directed to software modules for implementing the method and patterning processes employing the method are also disclosed.

13 Claims, 4 Drawing Sheets

U.S. PATENT DOCUMENTS

2009/0087754 A1* 4/2009 Aton .............................. 430/5
2009/0125870 A1* 5/2009 Aton et al. .................... 716/21

OTHER PUBLICATIONS

Aton. U.S. Appl. No. 11/863,717, filed Sep. 28, 2007.
Aton, U.S. Appl. No. 11/863,753, filed Sep. 28. 2007.
Aton et al., U.S. Appl. No. 11/940,016, filed Nov. 14, 2007.
Aton et al., U.S. Appl. No. 11/940,245, filed Nov. 14, 2007.
Aton et al., U.S. Appl. No. 11/940,194, filed Nov. 14, 2007.
Aton et al., U.S. Appl. No. 11/940,270, filed Nov. 14, 2007.

* cited by examiner

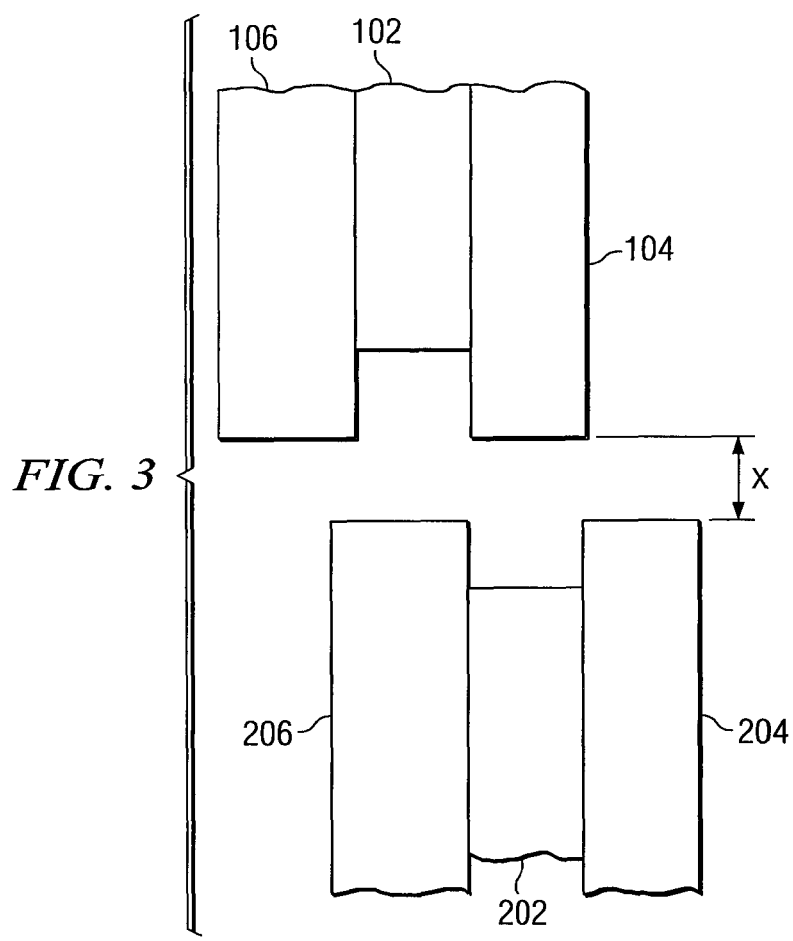
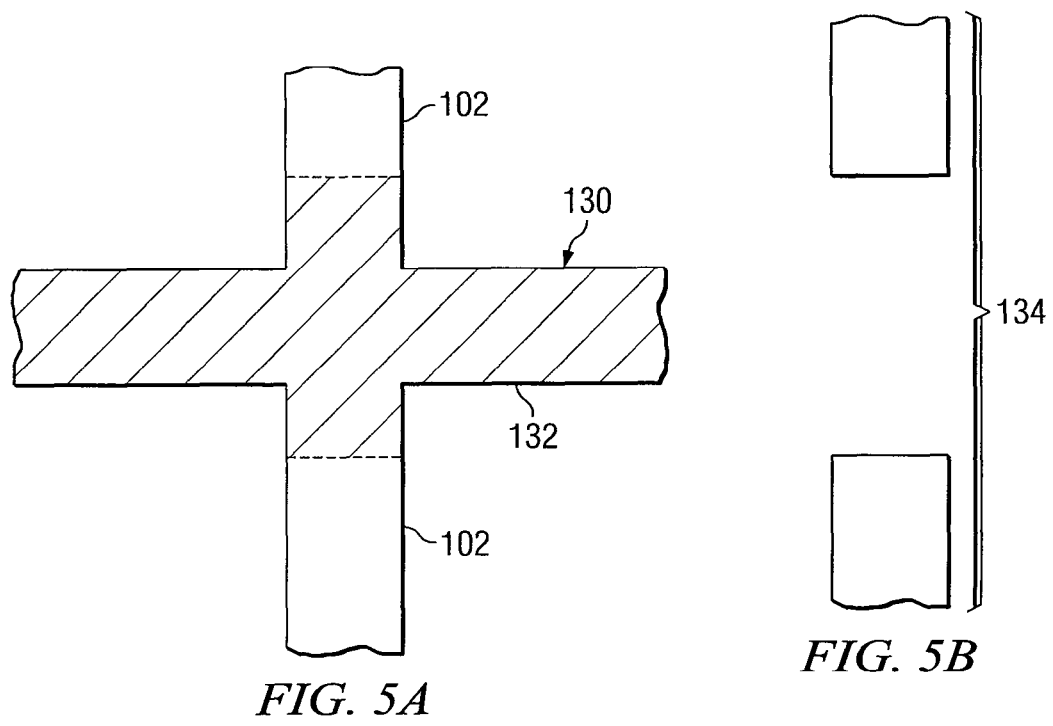

SYSTEM AND METHOD FOR MAKING PHOTOMASKS

This application is a Continuation-in-Part and claims the benefit of U.S. patent application Ser. No. 11/771,515, filed Jun. 29, 2007.

FIELD OF THE DISCLOSURE

The present application relates generally to the field of photolithography, and more specifically to a method and system for preparing a pattern for a photomask.

BACKGROUND

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In this process, a photomask, or "reticle", includes a semiconductor circuit layout pattern typically formed of opaque chrome, on a transparent glass (typically $SiO_2$) substrate. A stepper includes a light source and optics that project light coming through the photomask to image the circuit pattern, typically with a 4× to 5× reduction factor, on a photoresist film formed on a wafer. The term "chrome" refers to an opaque masking material that is typically but not always comprised of chrome. The transmission of the opaque material may also vary such as in the case of an attenuating phase shift mask.

As the critical dimensions of integrated circuits continue to decrease, there is a need to pattern smaller and smaller features. Modern photolithographic systems often employ light in the imaging process which has a larger wavelength than the critical dimensions of the device features being formed on the integrated circuits. When critical dimensions are printed at less than or equal to the wavelength of light being used, the wave properties of the light become a dominant property of the lithography. In general, these wave properties are seen as being a limiting factor in lithography. There are, however, techniques for extending optical lithography beyond the range of conventional imaging.

One such technique, known as strong phase shift lithography, employs phase shift masks (PSM) to take advantage of the constructive and destructive properties of light to improve feature definition. Strong phase shift lithography is often used to pattern transistor gates in, for example, CMOS technologies, where a small, well-controlled gate length can yield considerable performance advantage.

One of the most common commercial implementations of phase shift mask technology is the double exposure method. In this method, the critical features are imaged using a phase shift mask, and the non-critical and trim features are imaged in a second exposure using a conventional chrome-on-glass mask, such as a trim mask. In the past, both the phase exposure and trim exposure were performed using a single photoresist.

More recently, a new process has been developed, referred to herein as two-pattern/two-etch (2p/2e) or "double patterning," in which the phase exposure and trim exposure are each performed on separate photoresists. The patterns from each of the photoresists can be individually transferred to, for example, a hardmask. For example, a phase pattern may be formed in a first photoresist. The phase pattern can then be transferred to the hardmask using an etching technique. A trim pattern can then be formed in a second photoresist and the resulting photoresist pattern is then transferred to the hardmask using a second etching step. Subsequently, the hardmask pattern, having both the phase and trim patterns etched therein, is used to etch the wafer. In some processes, rather than employing a hardmask, the phase and trim patterns can be transferred directly to the wafer using the phase and trim photoresist patterns in two separate etch steps.

The 2p/2e processing allows for improvements in critical dimension control over single resist processing. However, the ever increasing densities of integrated circuit devices can make achieving the desired critical dimensions extremely difficult. Further refinements of the 2p/2e processing techniques are desired in order to achieve improved critical dimension control.

SUMMARY OF THE DISCLOSURE

In accordance with the disclosure, an embodiment of the present teachings is directed at a method for determining the position of a photomask pattern in a mask making process. The method comprises providing one or more mask rules defining the minimum spacing between photomask patterns. The method further comprises determining the position of a first photomask pattern relative to an adjacent second photomask pattern, the first photomask pattern having a critical edge for defining a critical dimension of a first device structure and a non-critical edge for defining a non-critical dimension. The non-critical edge is attached to the critical edge so that the positioning of the non-critical edge will affect the length of the critical edge. The non-critical edge of the first photomask pattern is positioned a distance X from an edge of the second photomask pattern, wherein the distance X is chosen to be substantially the minimum spacing allowed by the mask rules.

Another embodiment of the present application is directed to a multi-pattern process for patterning an integrated circuit device. The process comprises providing a substrate; forming a layer on the substrate; applying a first photoresist over the layer; exposing the first photoresist to radiation through a first photomask and developing the first photoresist to form a first pattern; etching to transfer the first pattern into the layer; removing the first photoresist; applying a second photoresist over the layer; exposing the second photoresist to radiation through a second photomask and developing the second photoresist to form a second pattern; etching to transfer the second pattern into the layer; and removing the second photoresist. Either the first or second photomask comprises a plurality of photomask patterns having positions determined by a positioning process. The positioning process comprises providing one or more mask rules defining the minimum spacing between photomask patterns. The positioning process further comprises determining the position of a first photomask pattern relative to an adjacent second photomask pattern, the first photomask pattern having a critical edge for defining a critical dimension of a first device structure and a non-critical edge for defining a non-critical dimension. The non-critical edge is attached to the critical edge so that the positioning of the non-critical edge will affect the length of the critical edge. The non-critical edge of the first photomask pattern is positioned a distance X from an edge of the second photomask pattern, wherein the distance X is chosen to be substantially the minimum spacing allowed by the mask rules.

Another embodiment of the present application is directed to a computer-readable storage medium with an executable software program stored thereon. The program is operable to instruct one or more computers to determine the position of a first photomask pattern relative to an adjacent second photomask pattern, the first photomask pattern having a critical edge for defining a critical dimension of a first device structure and a non-critical edge for defining a non-critical dimension. The non-critical edge is attached to the critical edge so that the positioning of the non-critical edge will affect the length of the critical edge. The non-critical edge of the first photomask pattern is positioned a distance X from an edge of the second photomask pattern, wherein the distance X is chosen to be substantially the minimum spacing allowed by the mask rules.

Additional objects and embodiments of the disclosure will be set forth in part in the description which follows, and can be learned by practice of the disclosure. It is to be understood that both the foregoing general description and the following detailed description are illustrative and explanatory only and are not restrictive of the disclosure, as claimed.

BRIEF DESCRIPTION OF THE DRAWINGS

The accompanying drawings, which are incorporated in and constitute a part of this specification, illustrate several embodiments of the disclosure and, together with the description, serve to explain the principles of the disclosure.

FIG. 3 illustrates a photomask pattern and an associated target pattern that is not part of the photomask pattern, according to another embodiment of the present application.

FIG. 5A illustrates a pattern formed on a substrate using the photomask patterns illustrated in FIG. 2A, according to an embodiment of the present application.

FIG. 5B illustrates a pattern formed on a substrate using both of the photomask patterns illustrated in FIGS. 2A and 2B, according to an embodiment of the present application.

DESCRIPTION OF THE EMBODIMENTS

Reference is now made in detail to various embodiments of the present application, examples of which are illustrated in the accompanying drawings. The same reference numbers are used throughout the drawings to refer to the same or like parts.

Photomask patterns that are used to generate photomasks generally include a plurality of polygon shaped patterns. The edges of these polygon patterns define boundaries that will be used to pattern a desired integrated circuit design to be fabricated. Every edge of the pattern can be assigned a different level of importance. Some pattern edges will be used to define critical dimensions of the integrated circuit design, such as, for example, a gate length. Other pattern edges may be used to pattern non-critical dimensions, such as interconnect widths or lengths, dummy features that are not a functional part of the device, ghost and trim features that may be subsequently removed, or gate ends formed over field regions.

In embodiments of the present application, the critical edges of a mask pattern are extended to permit proximity correction to more closely achieve the desired critical dimensions of the device given the spatial bandwidth limits of the imaging system. As discussed in greater detail below, for dense areas of the wafer, this generally means that the critical edges of the mask pattern are extended substantially as far as mask rules permit. For areas of the wafer that are not dense, the critical edges may be extended a desired distance that will result in effective proximity correction and good critical dimension control.

For any patterning scheme that employs multiple photomask/multiple etch processing (referred to herein as "multi-pattern processing"), the mask scheme partitions the device pattern to be formed on the wafer into at least two patterns. An example of multi-pattern processing is the 2p/2e process discussed above, where a device pattern is implemented using two photoresist patterning processes and two or more etch processes. Processes employing additional patterning and etching processes are also contemplated, such as multi-pattern processes that employ three or more photoresist patterning processes and/or three or more etch processes.

Any multi-pattern process will thus employ at least two separate photomask patterns. Each pattern may include some "real" edges and some "non-real" edges. "Non-real" edges define portions of a mask pattern that are not intended to be part of the integrated circuit pattern and which will not remain on the final wafer after patterning is complete. "Real" edges, on the other hand, define portions of the device pattern that will remain on the wafer. Real edges can be either critical or non-critical, while non-real edges, by definition, will not remain on the wafer and are therefore non-critical.

Figure 1A:
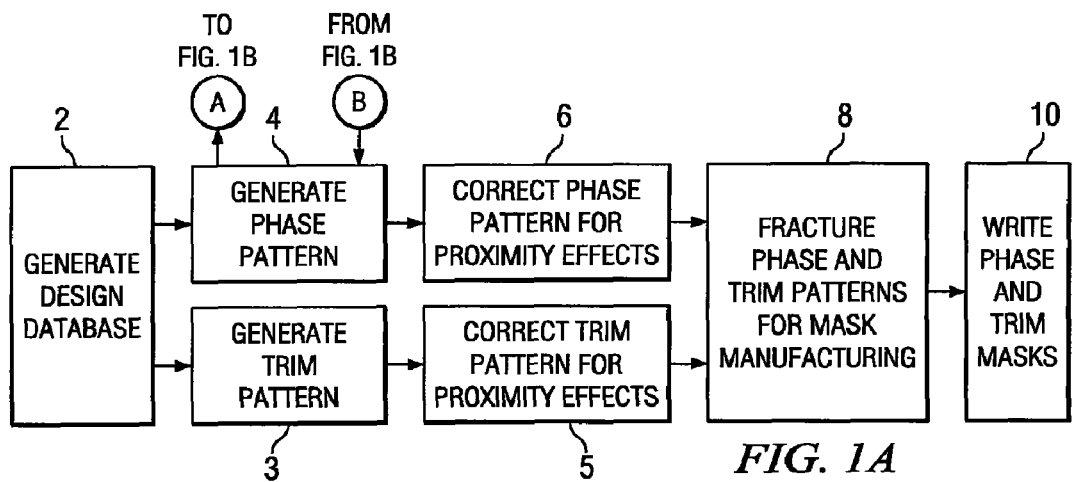
FIGS. 1A and 1B illustrate a flow diagram of a multi-pattern process for making a set of photomasks, according to an embodiment of the present disclosure.
Figure 1B:
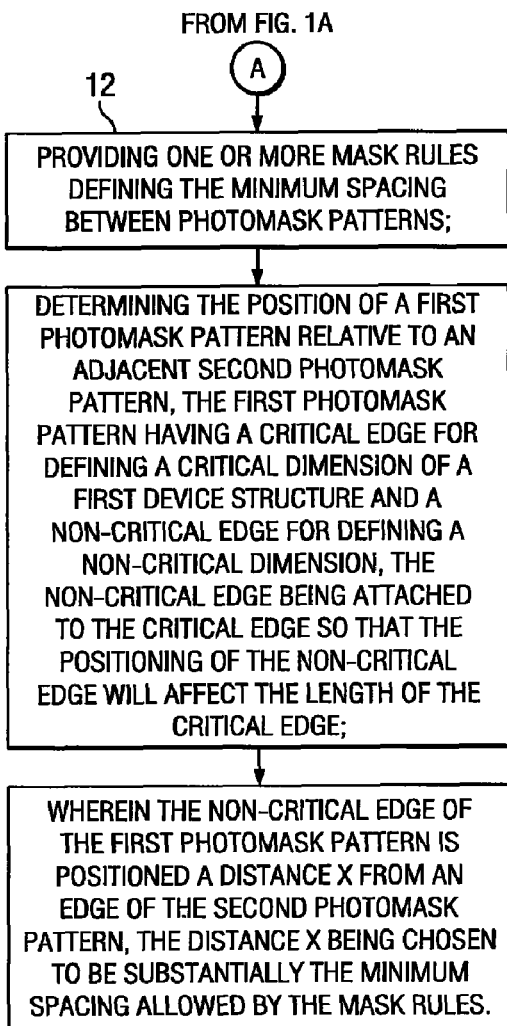

FIGS. 1A and 1B illustrate a flow diagram of one embodiment of a multi-pattern process for making a set of photomasks for an alternating phase shift process (altPSM), including a phase shift mask and a trim mask, used for pattering an integrated circuit device. The embodiments of the present application are not intended to be limited to the processes illustrated in FIGS. 1A and 1B, and other additional processes not shown in the flow diagram of FIGS. 1A and 1B may also be employed. For example, the addition of sub-resolution assist features is a well-known process which may be included in the method of FIGS. 1A and 1B, if desired.

Further, the processes of the present application are not limited to alternating phase shift technologies, but may also be employed for making any type of photomask for use in any multi-pattern process. For example, processes disclosed in FIG. 1B may be used as part of a multi-pattern process implemented using binary masks, embedded attenuated phase shift masks, hard phase shift masks, double-dipole exposure masks, or any other type of mask that can be used in a multi-pattern process.

As shown in block 2 of FIG. 1A, a design database is generated which contains data describing at least a portion of the integrated circuit design. From the design data, trim patterns and phase patterns may be generated to begin the formation of the trim mask and phase shift masks, respectively, as indicated in blocks 3 and 4. Methods for forming phase and trim patterns from design data are well known in the art, and any suitable method may be employed. In an embodiment, the phase and trim patterns are drawn using software programs designed to read data from the design database and prepare appropriate patterns for forming the masks used to make the integrated circuit designs described in the database. One example of a suitable software program is the iN-Phase™ software, which is available from Synopsys, Inc., Mountain View, Calif., USA.

The shape of the trim patterns and phase patterns generated in blocks 3 and 4 will generally reflect a target pattern, which is the desired shape of the pattern to be formed on the wafer. However, the shape of the final patterns formed on the photomasks may sometimes differ from the target pattern to take into account, for example, optical diffraction effects that occur during the imaging process. To account for such optical effects on patterning, the trim and phase patterns may be adjusted using optical proximity correction (OPC) techniques, as indicated in blocks 5 and 6 of the embodiment of FIG. 1A. Any suitable technique for correcting for optical proximity effects may be employed. Examples of suitable optical phase correction techniques are disclosed in U.S. Pat. No. 6,764,795, issued on Jul. 20, 2004 to Aton et al., the disclosure of which techniques is herein incorporated by reference in its entirety.

After correction of the phase and trim pattern for optical proximity effects, the mask pattern data is prepared for manufacturing, or writing, the mask. For example, as shown in block 8, the mask pattern data may be fractured, which puts the data in a form which is compatible with the mask writing process. The data fracture process may be accomplished using any suitable software program. One example of a suitable software program known in the art for mask data fracturing is the CATS™ software, which is available from Synopsys, Inc.

The mask data is then used to write the photomasks, as shown in block 10 of FIG. 1A. Any suitable technique for writing the photomask may be used. Suitable techniques for writing masks are well known in the art.

In an embodiment, the process of block 4 in FIG. 1A may include a method for determining the position of photomask patterns on the photomask, as indicated by arrows A and B adjacent to block 4 and described in FIG. 1B. In an alternative embodiment, the method of FIG. 1B for determining the position of photomask patterns on the photomask can be carried out during the proximity correction process of block 6, or at any other suitable time during the formation and/or positioning or repositioning of the photomask patterns.

As described in block 12 of FIG. 1B, this method for determining the position of photomask patterns may include providing one or more mask rules defining the minimum spacing between photomask patterns. Such mask rules are well known in the art and are generally determined empirically based on the manufacturing capabilities of the mask shop that makes the mask. The mask rules may be input in any desired manner into the software employed for generating the phase patterns and may be stored, for example, as mask rule data in a data base, such as the design data base.

As will be described in greater detail below, block 14 of the process of FIG. 1B includes determining the position of a first photomask pattern relative to an adjacent second photomask pattern. The first photomask pattern has both a critical edge for defining a critical dimension of a first device structure and a non-critical edge for defining a non-critical dimension. The non-critical edge can be attached to the critical edge so that the positioning of the non-critical edge will affect the length of the critical edge. As part of the process of determining the position of the first photomask pattern, as shown at 16 of FIG. 1B, the non-critical edge of the first photomask pattern is positioned a distance X from an edge of the second photomask pattern, wherein the distance X is chosen to be substantially the minimum spacing allowed by the mask rules.

The first and second photomask patterns can be for patterning any desired device structures on the same patterning level of an integrated circuit. In one embodiment, the first device structure is a gate, and the second device structure is some other device structure, such as an interconnect. In one embodiment, discussed in greater detail below, both first and second device structures are gates.

In an embodiment, the process also includes determining the position of the second photomask pattern, wherein the second photomask mask pattern has a critical edge for defining a critical dimension of a second device structure and a non-critical edge for defining a non-critical dimension. The non-critical edge can be attached to the critical edge so that the positioning of the non-critical edge will affect the length of the critical edge. As part of the process of determining the positions of the first and second photomasks, the non-critical edge of the first photomask pattern is positioned a distance X from the non-critical edge of the second photomask pattern, wherein the distance X is chosen to be the minimum spacing allowed by the mask rules.

For processes involving two or more exposures and etches, such as 2p/2e processes, positioning the non-critical edge of the first photomask pattern at the minimum spacing, or substantially the minimum spacing, allowed by the mask rules can provide an effective and easily implemented solution for improving critical dimension control, as explained in more detail below. The phrase "substantially the minimum spacing" is defined herein as a distance within about 5 nm of the minimum spacing, but which distance is within tolerances for meeting the minimum spacing requirement defined by the mask rules. In some embodiments, the distance X can be chosen to be a distance within about 3 nm, or 1 nm, of the minimum spacing. In yet other embodiments, the distance X can be defined in terms of a percentage of the minimum spacing. For example, the distance X can be chosen to be a distance ranging from a value that is about 40% greater than the minimum spacing to the minimum spacing, such as about 25%, about 15% or about 10% greater than the minimum spacing.

The dimensions disclosed for X, as well as any other pattern dimensions disclosed herein unless otherwise expressly stated, are based upon the size of the pattern to be formed on the wafer. The actual dimensions that correspond to X for the photomask patterns will vary depending upon the size of the reduction factor of the photomask. As discussed above, photomasks are often formed to have, for example, a 4× or 5× reduction factor, meaning that the photomask pattern dimensions can be about 4 or 5 times larger than the corresponding dimensions formed on the wafer. Similarly, the dimensions of the drawn pattern may or may not also have a reduction factor. Therefore, as one of ordinary skill in the art would readily understand, the mask sizes and the drawn pattern sizes can correspond to the wafer dimensions based on any suitable reduction factor, including where the dimensions on the mask and/or drawn pattern dimensions are intended to be the same as those formed on the wafer.

Figure 2A:
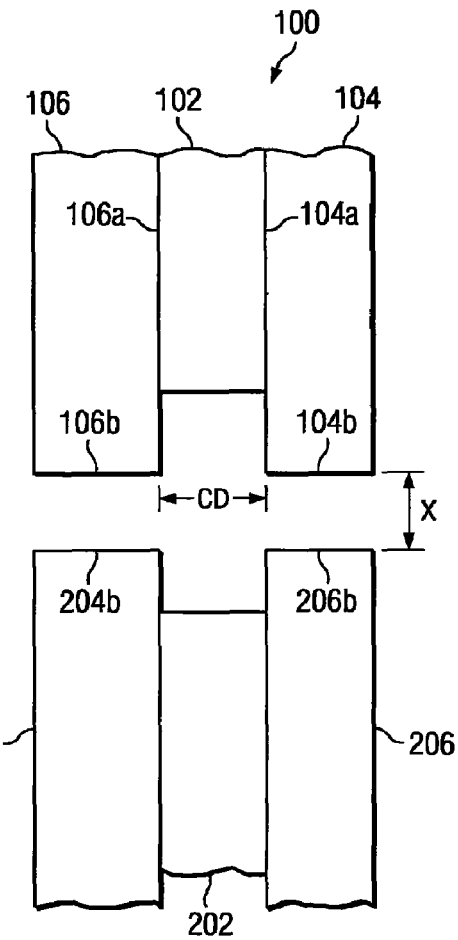
FIGS. 2A and 2B illustrate photomask patterns and associated target patterns that are not part of the photomask pattern, according to an embodiment of the present application.
Figure 2B:
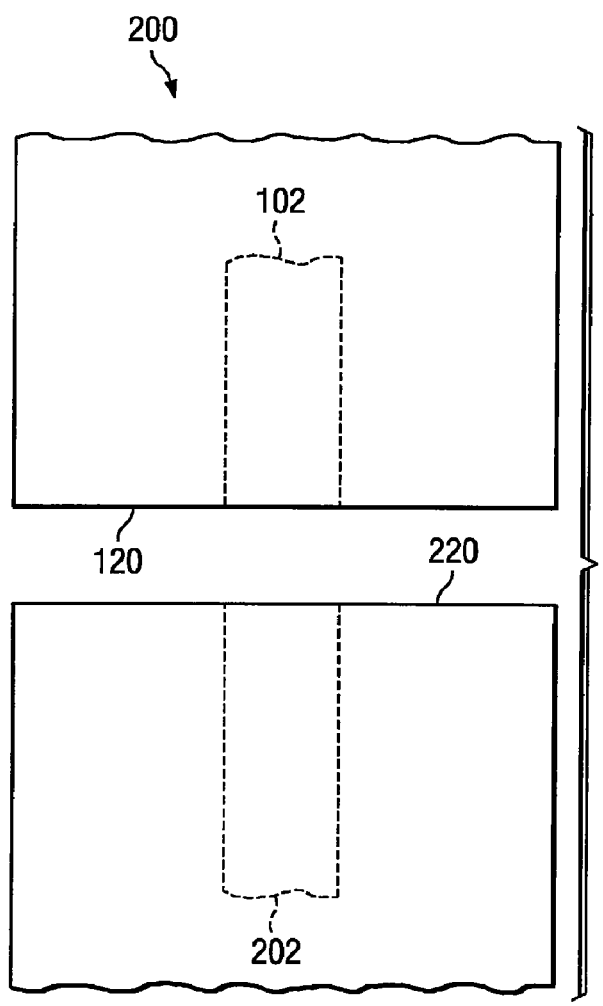

FIGS. 2A and 2B illustrate phase and trim patterns for generating desired target patterns 102 and 202, according to an embodiment of the present application. The target patterns may be for any desired devices to be patterned that have a critical dimension ("CD"). The term "critical dimension" is defined herein as the width of a patterned line that must be within design tolerances in order to maintain device performance consistency. For example, in one embodiment the target patterns 102 and 202 are for gates, and the CD for each target pattern is gate length. In another embodiment, the target patterns are for metallic lines, and the CD for each target pattern can be the width of the metallic lines.

Photomask patterns 104 and 106 are positioned by the pattern generating software so as to define the target pattern 102 and achieve the desired CD. In one embodiment, photomask patterns 104 and 106, as well as patterns 204 and 206 (described below) can represent substantially clear apertures, and the spaces between them can represent substantially opaque regions of the photomask. In another embodiment, photomask patterns 104 and 106, and 204 and 206, can represent substantially opaque patterns, and the spaces between them can be substantially clear regions of the photomask. As is well known in the art, the transmission of the opaque material may vary, such as in the case of an embedded attenuated phase shift mask.

In an embodiment of FIG. 2A, photomask patterns 104 and 106 are phase blocks of a first phase type and a second phase type. The first and second phase types may be chosen so that phase blocks of a first and a second phase type are positioned in an alternating pattern in a manner that allows the constructive and destructive properties of the light used in the imaging process to improve pattern definition, as is well known in the art. Thus, phase pattern 104 can be what is known in the art as a "zero phase block"; and phase pattern 106 can be a "π phase block," which results in light that is 180° out of phase with the zero phase block 104.

Phase patterns 104 and 106 each have at least one critical edge, 104a and 106a, respectively, that defines the CD of target pattern 102. In addition, phase patterns 104 and 106 each have at least one non-critical edge 104b and 106b, respectively, for defining a non-critical dimension. The non-critical edges 104b and 106b are attached to the critical edges 104a and 106a, respectively, so that the positioning of the non-critical edges will affect the length of the critical edges. In this embodiment, as will be discussed in greater detail below, the hardmask or device pattern edges that the non-critical photomask pattern edges define can subsequently be removed by the trim mask.

FIG. 2A illustrates a second target pattern 202 adjacent to the first target pattern 102. As one of ordinary skill in the art would readily appreciate, the target patterns as they are outlined in FIGS. 2A, 2B and 3 are not part of the actual photomask pattern. Photomask patterns 204 and 206 are positioned by the pattern generating software so as to define the target pattern 202 and achieve the desired CD, in a similar manner as described above for target pattern 102. Photomask patterns 204 and 206 can be phase blocks of a first phase type and a second phase type. For example, phase pattern 204 can be a "zero phase block" and phase pattern 206 can be a "π phase block." The non-critical edges 104b and 106b of first photomask patterns 104 and 106 are positioned a distance X from the non-critical edges 204b and 206b of second photomask patterns 204 and 206, as illustrated in FIG. 2A.

In an embodiment, phase patterns 104 and 106 may be not collinear with phase patterns of the same type used to define the adjacent second target pattern 202. For example, phase pattern 104 can be a zero phase block, which is positioned adjacent to and collinear with phase pattern 206, a π phase block. Further, in some embodiments, as shown in FIG. 3, the longitudinal axis of target patterns 102 and 202 are not collinear, and thus, consequently, the associated phase patterns 104 and 106, and 204 and 206, are also not collinear.

It has been found that in instances where the non-critical end edges of adjacent patterns are not collinear with phase patterns of the same type, improved CD control can be obtained when X is chosen to be substantially the minimum spacing allowed by the mask rules. This is, at least in part, because maintaining good CD control near the end regions of a pattern can be difficult. These end region effects may be due to a number of things, such as the lack of control of the spatial response of the lithographic system, the limits of how sharply imaged photoresist patterns can change shape over very short distances, diffraction off the ends of the phase shift blocks, and diffraction from other devices patterned near the end regions of the target pattern 102. To help maintain good CD control near target pattern regions, non-critical edges 104b and 106b can be positioned so as increase the length of critical edges 104a and 106a substantially as far as possible past the end of target pattern 102, while still meeting the minimum spacing requirements of the mask rules. This results in the end effects being reduced near the target pattern regions and permits proximity correction to more closely achieve the desired critical dimension of the device given the spatial bandwidth limits of the imaging system.

FIG. 2B illustrates an embodiment of trim mask patterns 120 and 220, which can be employed in designing the trim mask for patterning target patterns 102 and 202. The trim mask patterns 120 and 220 define the end edges of target patterns 102 and 202, which are not patterned over active regions and are considered non-critical edges. Any suitable method for making the trim mask may be employed, including, but not limited to, techniques for forming trim mask patterns that are well known in the art.

In other embodiments, trim mask patterns may define critical dimensions of the devices to be manufactured. In such cases, the techniques discussed herein for processing critical edges of the trim mask patterns can be employed. For example, the method for determining the position of a photomask pattern shown in FIG. 1B may be employed using the general principles described above in order to make the trim mask pattern.

As described above with reference to FIG. 1A, after the phase and trim patterns are generated, additional processing of the patterns is carried out to, for example, correct the mask patterns for proximity effects and prepare the patterns to send to the mask manufacturer. The mask manufacturer then writes the phase and trim masks, which can be used to manufacture integrated circuit devices.

Figure 6:
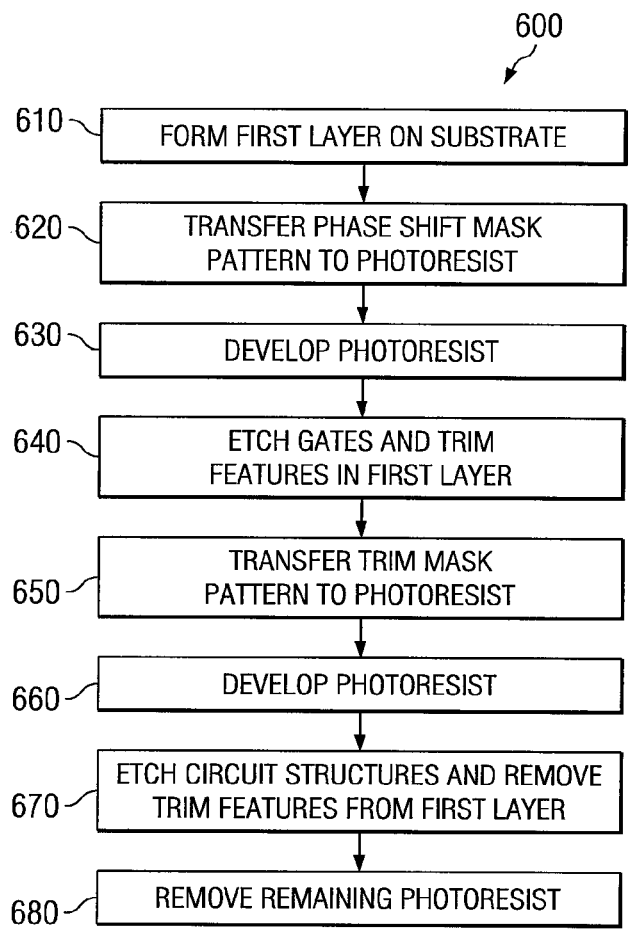
FIG. 6 illustrates a flow chart of an example method for forming a semiconductor device using the photomasks of the present application.

An example method 600 for forming a semiconductor device using the photomasks of the present application is shown in FIG. 6. While phase shift and trim photomasks are employed for illustrative purposes in the method 600, any suitable mask types can be employed. For example, two embedded attenuated phase shift masks can be employed. In addition, one of ordinary skill in the art would readily understand that more than two photomasks can also be employed. At 610, a first layer, including one or more of a hardmask and a device layer, can be formed on a substrate. The device layer can include any desired material suitable for making the desired device, including conductive materials, such as metals and doped polysilicon; and semiconducting and insulating materials, such as undoped polysilicon, oxides, and nitrides. In an embodiment, the device layer includes at least one material chosen from metals and polysilicon.

A photoresist layer can be formed on the first layer. At 620, a beam of radiation can be used to transfer the pattern of a phase shift mask that includes target pattern features to the photoresist. For example, the pattern of phase shift mask 100, shown in FIG. 2A, can be transferred to the photoresist. At 630 of FIG. 6, the photoresist with the imaged pattern of the phase shift mask can be developed. As illustrated in FIG. 5A, this process forms a photoresist pattern 130, such that the image includes target features 102 and trim features 132, represented by the hatched regions of pattern 130. The gate features and the trim features in the photoresist, as shown for example in FIG. 5A, can then be transferred at 640 into the first layer by a first etch.

After forming the target features and the trim features in the first layer at 640 of FIG. 6, the first photoresist is removed and a second photoresist layer is deposited. A second exposure process can then be used to transfer the pattern of the trim mask to the second photoresist at 650 of FIG. 6. For example, the photoresist at 650 can be exposed to radiation through trim mask 200 to image a trim pattern, such as shown in FIG. 2B, in the photoresist. The photoresist pattern can then be developed, as at 660, to form the trim pattern in the photoresist. The trim mask can be aligned with the pattern of FIG. 5A during the second exposure so that the resulting photoresist trim pattern is positioned so as to remove the trim features 132 of FIG. 5A during the subsequent etch process at 670. FIG. 5B illustrates an example of the resulting feature patterns 134 after the etch process at 670 has been carried out. After the etch process, the remaining photoresist can be removed at 680.

While only two patterned features 134 are illustrated in FIG. 5B, one of ordinary skill in the art would readily understand that in practice, a large number of features may be patterned on the substrate. For example, in the case of gate structures, a plurality of gate arrays can be formed, similarly as shown in FIG. 4.

Figure 4:
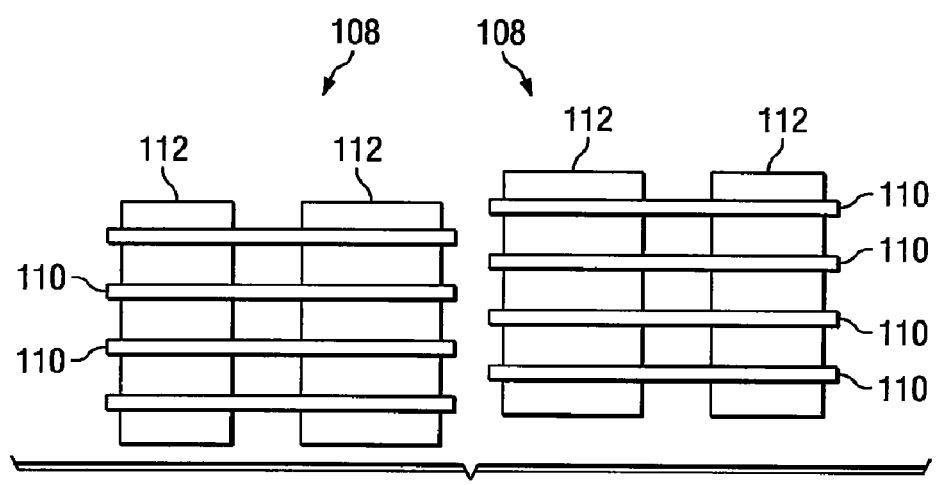
FIG. 4 illustrates adjacent circuit cells having gates formed over active regions, as is well known in the art.

FIG. 4 shows adjacent circuit cells 108 having gates 110 formed over active regions 112, as is well known in the art. For denser areas of the substrate having such adjacent circuit cells, the mask rules can be used to determine the distance X between the non-critical edges of the photomask pattern, where the individual cell devices, such as the ends of gates 110, are positioned proximate an adjacent cell. This can be accomplished in a similar manner as described above with reference to FIG. 2A.

However, there may be instances, such as in less dense regions of a substrate, where ends of devices in a circuit cell are not adjacent another circuit cell device. In such cases, the mask rules may not provide a desirable basis for positioning the non-critical edges of the mask pattern as described above, because the mask rules will allow the critical edges to be extended farther than is necessary or practical to provide the desired critical dimension control. For such situations, the mask rules may not provide a minimum distance X that can provide a desirable basis for positioning the non-critical edges.

Thus, in some embodiments, the methods of the present application may include a step for determining, prior to determining a position of the non-critical edge of the first photomask pattern at 14 in FIG. 1B, whether the mask rules will provide an appropriate basis for positioning the non-critical edge; and, if the mask rules do not provide an appropriate basis, then the position of the non-critical edge of the first photomask pattern may not be determined by choosing a distance X to be substantially the minimum spacing allowed by the mask rules, as described above. Instead, the positioning of the non-critical edge of the first photomask pattern may be determined by any suitable manner so as to extend the critical edge of the first photomask pattern a desired distance that will result in effective proximity correction and good critical dimension control. For example, the non-critical edge can be positioned by empirical testing and/or by employing proximity correction software to calculate a desired position.

Referring again to FIG. 6, in some embodiments where the first layer at 610 comprises both a hardmask and a device layer, the phase pattern and the trim pattern can be transferred first to the hardmask in steps 640 and 670. The hardmask pattern can then be transferred to the device layer using a separate etch step (not shown), following removal of the photoresist at 680. Example hardmask materials can include silicon oxynitride, silicon nitride, and silicon oxide, as well as other materials known to one of ordinary skill in the art.

Alternatively, when only a photoresist and device layer are present, the gate features and the circuit structure features in the photoresist can be transferred directly to the device layer during steps 640 and steps 670.

The concepts of the present application can generally be applied to any number of devices of an integrated circuit. In some embodiments, the disclosure is contemplated for use in non-memory portions of a device, such as the logic or "random logic" portions of the device. The term "random logic" is defined herein to include all portions of the device with the exception of RAM memory portions (e.g., SRAM and DRAM), which RAM portions generally comprise small bit cells repeated a relatively large number of times. However, the processes can potentially be employed for choosing a distance X, as described herein, in any part of a device, including memory portions. In some embodiments, the process can be applied to, for example, 10% or more of the gates employed in random logic portions of an integrated circuit, such as about 50%, about 60%, about 80% or about 90% or more of the gates.

Figure 7:
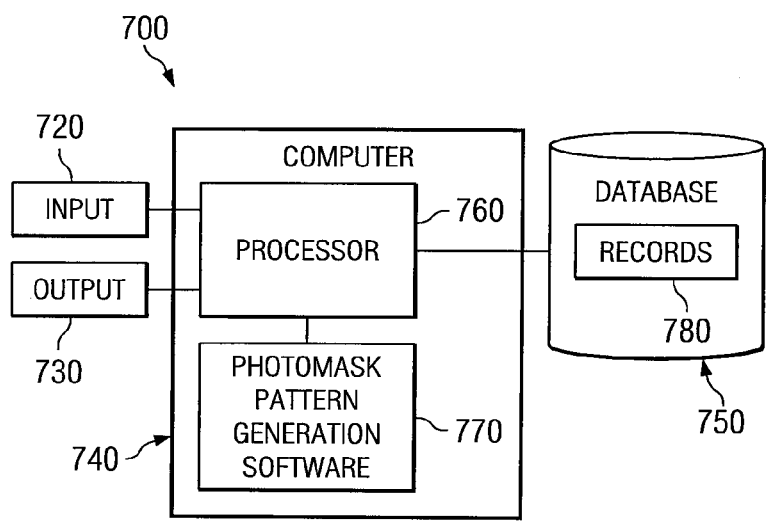
FIG. 7 illustrates a system for forming a photomask pattern, according to an embodiment of the present application.

FIG. 7 illustrates a system 700 for forming a photomask pattern of the present application. System 700 includes an input device 720 and an output device 730 coupled to a computer 740, which is in turn coupled to a database 750. Input device 720 may comprise, for example, a keyboard, a mouse, or any other device suitable for transmitting data to computer 740. Output device 730 may comprise, for example, a display, a printer, or any other device suitable for outputting data received from computer 740.

Computer 740 may comprise a personal computer, workstation, network computer, wireless computer, or one or more microprocessors within these or other devices, or any other suitable processing device. Computer 740 may include a processor 760, and photomask pattern generation software 770.

Photomask pattern generation software 770 can exist as software that comprises program instructions in source code, object code, executable code or other formats; program instructions implemented in firmware; or hardware description language (HDL) files. Any of the above can be embodied on a computer readable medium, which includes storage devices and signals, in compressed or uncompressed form. Example computer readable storage devices include conventional computer system RAM (random access memory), ROM (read-only memory), EPROM (erasable, programmable ROM), EEPROM (electrically erasable, programmable ROM), and magnetic or optical disks or tapes.

Processor 760 controls the flow of data between input device 720, output device 730, database 750, and photomask pattern generation software 770. Photomask pattern generation software 770 may receive descriptions of integrated circuit device features from design database 750 and generate photomask patterns, including positioning of the photomask patterns using the process of FIG. 1B, as described above. In various embodiments, the processes for generating the photomask patterns may be accomplished by separate software code, which may be stored on separate databases and/or employed by one or more computers. For example, separate software may be employed for generating phase patterns and trim patterns on the same computer, or alternatively, on two different computers.

Database 750 may comprise any suitable system for storing data. Database 750 may store records 780 that comprise data associated with the integrated circuit device features, such as data from a design database, as described above. Records 780 may also comprise data associated with mask rules and other data usable in a photomask pattern generation process.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for forming a phase shifting photomask for use in a lithography process for imaging device structures of a same patterning level onto radiation sensitive material in the fabrication of an integrated circuit, the method comprising:
   providing a design for the integrated circuit, the design including first and second adjacent device structures;
   providing one or more mask rules defining the minimum spacing between photomask patterns;
   determining a position of a first photomask pattern having a critical edge for defining a critical dimension of the first device structure and a non-critical edge for defining a non-critical dimension of the first device structure, the non-critical edge being attached to the critical edge so that the positioning of the non-critical edge will affect the length of the critical edge;
   determining a position of a second photomask pattern having a critical edge for defining a critical dimension of a second device structure and a non-critical edge for defining a non-critical dimension of the second device structure, the non-critical edge being attached to the critical edge so that the position of the non-critical edge will affect the length of the critical edge, the critical edge of the first photomask pattern being generally parallel to the critical edge of the second photomask pattern, and the non-critical edge of the first photomask pattern being adjacent and generally parallel to the non-critical edge of the second photomask pattern;
   determining a spacing distance of the non-critical edge of the first photomask pattern from the adjacent non-critical edge of the second photomask pattern;
   if the spacing distance is greater than the defined minimum spacing, repositioning the non-critical edge of at least one of the first or second photomask patterns to reestablish the spacing distance to be substantially the defined minimum spacing; and
   forming the phase shifting mask photomask with the positions of the first and second photomask patterns after the repositioning.

2. The method of claim 1, wherein the first and second photomask patterns are phase patterns of opposite 0 and $\pi$ phases, respectively.

3. The method of claim 1, wherein the first and second device structures are gate structures and the critical dimensions establish gate length.

4. The method of claim 3, wherein longitudinal axes of the first and second photomask patterns are collinear.

5. The method of claim 1, wherein the first and second device structures are metallic lines and the critical dimensions are widths of the metallic lines.

6. The method of claim 1, wherein the design for the integrated circuit further includes a third device structure; and the method further comprises:
   determining a position of a third photomask pattern, the third photomask pattern having a critical edge for defining a critical dimension of the third device structure and a non-critical edge for defining a non-critical dimension of a third device structure, the non-critical edge being attached to the critical edge so that the positioning of the non-critical edge will affect the length of the critical edge;
   determining that there is no adjacent edge of another photomask pattern within a spacing distance threshold from the non-critical edge of the third photomask pattern; and
   if it is determined that there is no adjacent edge, repositioning the non-critical edge of the third photomask pattern to lengthen the critical edge by a given amount.

7. A computer system for generating a photomask pattern, the system comprising one or more computers comprising a set of computer readable instructions for carrying out the method of claim 1.

8. A computer readable medium comprising computer readable instructions embedded thereon for carrying out the process of claim 1.

9. A method for fabricating an integrated circuit device using a lithography process and based on a design including first and second adjacent device structures of a same patterning level, the process comprising:
   providing a phase shifting photomask formed according to a process including:
      determining a position of a first photomask pattern having a critical edge for defining a critical dimension of the first device structure and a non-critical edge for defining a non-critical dimension of the first device structure, the non-critical edge being attached to the critical edge so that the positioning of the non-critical edge will affect the length of the critical edge;
      determining a position of a second photomask pattern having a critical edge for defining a critical dimension of a second device structure and a non-critical edge for defining a non-critical dimension of the second device structure, the non-critical edge being attached to the critical edge so that the position of the non-critical edge will affect the length of the critical edge, the critical edge of the first photomask pattern being generally parallel to the critical edge of the second photomask pattern, and the non-critical edge of the first photomask pattern being adjacent and generally parallel to the non-critical edge of the second photomask pattern;
      determining a spacing distance of the non-critical edge of the first photomask pattern from the adjacent non-critical edge of the second photomask pattern;
      if the spacing distance is greater than a defined minimum spacing, repositioning the non-critical edge of at least one of the first or second photomask patterns to reestablish the spacing distance to be substantially the defined minimum spacing; and
      forming the phase shifting mask photomask with the positions of the first and second photomask patterns after the repositioning;
   forming a layer of radiation sensitive material over a substrate; and imaging the first and second device structures onto the layer of radiation sensitive material at least partly through the phase shifting photomask.

10. The method of claim 9, further comprising providing a trim photomask; and forming a layer of gate forming material over the substrate, the layer of radiation sensitive material being a first layer of photoresist material formed over the layer of gate forming material; developing the first layer of photoresist material following the imaging to pattern the layer of photoresist material; and etching the layer of gate forming material through the patterned layer of photoresist material.

11. The method of claim 9, wherein the first and second device structures are gate structures and the critical dimensions establish gate length.

12. The method of claim 9, further comprising providing a trim photomask; and wherein the imaging the first and second device structures comprises imaging the device structures in a first imaging through the phase shifting photomask and a second imaging through the trim photomask.

13. The method of claim 12, further comprising forming a layer of hardmask material over the substrate; and wherein the first and second imaging steps are performed with additional steps including imaging onto at least the first layer of photoresist material, to pattern the layer of hardmask material.

* * * * *